United States Patent
Markow et al.

[19]

[11] Patent Number: 5,880,933
[45] Date of Patent: Mar. 9, 1999

[54] HEAT SINKING MODULE COVER

[75] Inventors: Paul A. Markow, Huntsville; Karl W. Shock; Bradley S. Chupp, both of Madison; Frank R. Holmes, Huntsville; Terry P. Mach, Madison, all of Ala.

[73] Assignee: DaimlerChrysler Corporation, Auburn Hills, Mich.

[21] Appl. No.: 912,262

[22] Filed: Aug. 18, 1997

[51] Int. Cl.$^6$ .................................................. H05K 7/20
[52] U.S. Cl. .................. 361/704; 361/695; 361/706; 361/710; 361/712; 165/80.3; 165/80.4; 165/185; 257/706; 257/707; 257/713; 257/718; 174/16.3
[58] Field of Search ..................... 257/707, 718; 165/80.3, 80.4, 165; 174/52.4; 29/840; 361/704, 697, 707, 705, 719

[56] References Cited

U.S. PATENT DOCUMENTS

| | | | |
|---|---|---|---|
| 4,471,407 | 9/1984 | Sleder | 361/704 |
| 4,649,990 | 3/1987 | Kurihara et al. | 165/80.4 |
| 4,891,735 | 1/1990 | Mikolajczak | 361/419 |
| 4,922,601 | 5/1990 | Mikolajczak | 29/450 |
| 4,923,179 | 5/1990 | Mikolajczak | 267/160 |
| 5,161,087 | 11/1992 | Frankeny et al. | 361/382 |
| 5,170,323 | 12/1992 | Perretta et al. | 361/386 |
| 5,208,731 | 5/1993 | Blomquist | 361/386 |
| 5,225,965 | 7/1993 | Bailey et al. | 361/386 |
| 5,227,663 | 7/1993 | Patil et al. | 257/718 |
| 5,274,193 | 12/1993 | Bailey et al. | 174/16.3 |
| 5,276,585 | 1/1994 | Smithers | 361/704 |
| 5,327,324 | 7/1994 | Roth | 361/707 |
| 5,450,284 | 9/1995 | Wekell | 361/710 |
| 5,567,986 | 10/1996 | Ishida | 257/707 |
| 5,590,026 | 12/1996 | Warren et al. | 361/704 |
| 5,615,735 | 4/1997 | Yoshida et al. | 165/80.3 |

*Primary Examiner*—Leo P. Picard
*Assistant Examiner*—Michael Datskovsky
*Attorney, Agent, or Firm*—Mark P. Calcaterra

[57] ABSTRACT

A heat sinking module cover for use with a potted electronic module assembly is disclosed. An electronic module assembly contains heat generating electrical components. Typically the electrical components are held in relation to a module housing. The module housing, generally, not only provides support but also acts as a heat sink for heat generating electrical components. The electrical components are covered by a potting compound. The potting compound protects the electrical components from dust or any other particles that could affect the function of the electrical component. The present invention discloses a heat sinking module cover with a support portion and a thermal transfer portion. The heat sinking module cover is positioned with respect to the module housing to form a box-like structure. The thermal transfer portion contacts the potting material directly to provide an additional heat sinking means for the electronic module assembly.

2 Claims, 1 Drawing Sheet

HEAT SINKING MODULE COVER

BACKGROUND OF THE INVENTION

1. Technical Field

The present invention relates in general to heat sink assemblies for electronic modules, and more specifically to module covers that provide additional heat sink capabilities.

2. Description of the Related Art

Electronic modules typically contain a module housing. Electrical components are generally held in relation to the module housing. The module housing, generally, not only provides support but also acts as a heat sink for heat generating electrical components. Some electronic modules contain a potting compound to protect the electrical components against dust as well as the environment. The potting compound is typically a polymer, flow-able reactants combine to produce a gelatinous substance that forms in the shape which is provided by the physical constraints of its surroundings. This potting compound covers the electrical components in these electronic modules. Typically, after the potting compound is formed in the electronic module a cover is positioned with respect to the module housing to form a box-like structure. Occasionally, the flow-able reactants are transported into the module via a hole located, typically, in the cover. After the reactants flow into the module, the potting compound is formed by gelatinization and the hole is capped. Both instances leave an air gap between the potting compound and the module cover, which essentially eliminates heat transfer from the electrical components though the module cover. Therefore, it is desirable to design a heat sinking module cover that displaces the air gap between the potting compound and the module cover while retaining the ability to employ a conventional method of inserting a potting compound into an electronic module.

SUMMARY OF THE INVENTION

It is, therefore, an object of the present invention to provide an improved heat sinking module cover having a support portion and a thermal transfer portion. The thermal transfer portion contacts the potting directly; therefore, providing an additional means to heat sink a heat generating electrical component contained within the electronic module.

It is another object of the present invention to provide a heat sinking module cover that displaces the air gap between the module cover and the potting compound in order to enable heat to be transferred from a heat generating electrical component to the module cover.

Other objects, features, and advantages will become more apparent to those skilled in the art as the following description, drawings, and claims are presented to the reader.

DETAILED DESCRIPTION OF THE PREFERRED EMBODIMENT

Figure 1:
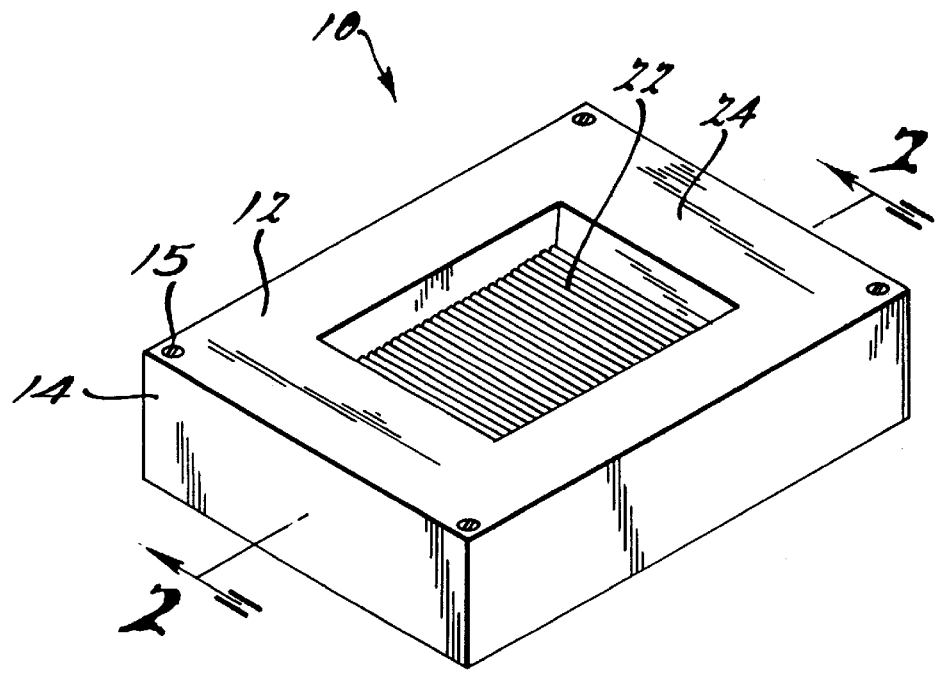
FIG. 1. An assembled view of the entire electronic module assembly.

FIG. 1. depicts the exterior appearance of a electronic module assembly 10. The heat sinking module cover 12 is attached to the module housing 14 by screws 15, however any location or type of attachment means would not deviate from the scope of the present invention. Typically, the module housing 14 has a generally planar bottom surface 16.

Figure 2:
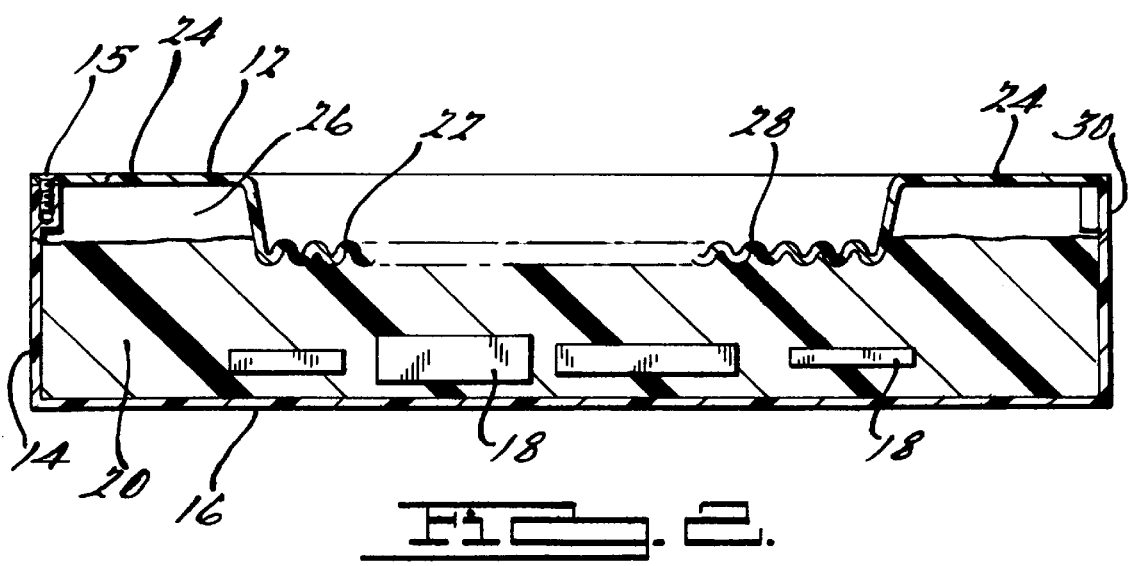
FIG. 2. A sectional view taken along the line 2—2 of FIG. 1.

FIG. 2. Shows a sectional view of the contents of the electronic module assembly 10. A plurality of electrical components 18 are contained within the assembly and held in relation to the module housing 14. The electrical components could be held by many various means (not shown), they could be clipped or glued to the module housing, or attached to a circuit board which is attached to the module housing by screws, etc. The potting compound 20 in its gelatinous form covers the electrical components 18 in order to protect the electrical components 18 from dust or other particles that could alter the function of the electrical components 18. The potting compound 20 is disposed between the bottom surface 16 of the module housing 14 and the heat sinking module cover 12. The heat sinking module cover 12 is designed with a thermal transfer portion 22 that protrudes inwardly from the support portion 24 of the heat sinking module cover 12. The thermal transfer portion 22 has two surfaces, an outer surface 31 and an inner surface 32 that contacts the potting compound 20 as shown in FIG. 2. The thermal transfer portion 22 is formed from a material that is suitable to conduct heat. The thermal transfer portion 22 at its inner surface 32 contacts the potting compound 20 directly above the electrical components 18. The inwardly protruding thermal transfer portion 22 displaces the air 26 positioned above the potting compound 20. In the preferred embodiment, as the heat sinking module cover 12 is installed the air 26 is displaced to a position away from the electrical components 18, to the sides of the assembly, most of the air escapes before the attachment of the heat sinking module cover 12 to the module housing 14. In the preferred embodiment, the thermal transfer portion 22 of the heat sinking module cover 12 contains a corrugated pattern 28 in order to increase the surface area that is available for the transfer of heat from the electrical components 18. However, any formations, such as a saw-toothed pattern, protruding fins, or any irregular formations that increase the surface area vs. a planar surface would not deviate from the scope of this invention. In the preferred embodiment, the support portion 24 is simply a generally planar structure that surrounds the thermal transfer portion 22. However, the support portion 24 could be formed in any way to establish a contact with the module housing 14. The support portion 24 having contact with the module housing 14 defines the position of the thermal transfer portion 22. The support portion 24 can form a planar surface for contact with the side walls 30 or can form the side walls 30 of the electronic module assembly 10 itself. The support portion 24 can most simply be described as a continuation of the thermal transfer portion 22 that contacts the module housing 14.

While the preferred embodiment has been described in accordance with the present invention, it is understood that the invention is susceptible to numerous changes and modifications from those skilled in the art without deviating from the scope and spirit of the following claims.

What is claimed is:

1. An electronic module assembly with a module housing having a bottom surface, comprising:

a heat generating electrical component disposed above said bottom surface;

a gelatinous potting compound substantially encapsulating said electrical component, potting compound; and a module cover disposed to contact said potting compound, said module cover comprising:

a thermal transfer portion having an inner and an outer surface, said inner surface being in substantial contact with said potting compound;

a support portion for establishing the position of the thermal transfer portion;

said thermal transfer portion having a corrugated pattern on said inner surface and said outer surface to increase surface area compared to a planar surface; and said thermal transfer portion being formed from a material suitable to conduct heat.

2. The invention according to claim 1, wherein said support portion and said thermal transfer portion integrally form said heatsinking module cover.

* * * * *